United States Patent
Sung et al.

(10) Patent No.: US 8,062,538 B2
(45) Date of Patent: Nov. 22, 2011

(54) ETCHING APPARATUS AND METHOD FOR SEMICONDUCTOR DEVICE

(75) Inventors: Doug Yong Sung, Suwon-si (KR);
Tae-Yong Kwon, Suwon-si (KR);
Kyung Hyun Han, Suwon-si (KR);
Kyung Chun Lim, Suwon-si (KR);
Sang Min Jeong, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 801 days.

(21) Appl. No.: 12/078,177

(22) Filed: Mar. 27, 2008

(65) Prior Publication Data
US 2008/0248650 A1 Oct. 9, 2008

(30) Foreign Application Priority Data
Apr. 3, 2007 (KR) ........................ 10-2007-0033006

(51) Int. Cl.
*B44C 1/22* (2006.01)
*C03C 15/00* (2006.01)
*C03C 25/68* (2006.01)
*C23F 1/00* (2006.01)

(52) U.S. Cl. ......................... 216/41; 438/689
(58) Field of Classification Search .................... 216/41; 438/689
See application file for complete search history.

(56) References Cited

U.S. PATENT DOCUMENTS

| 2002/0102500 A1 | 8/2002 | Hung et al. |
| 2004/0072430 A1* | 4/2004 | Huang et al. ................. 438/689 |
| 2005/0287771 A1* | 12/2005 | Seamons et al. ............. 438/482 |

FOREIGN PATENT DOCUMENTS

| JP | 06-151383 | 5/1994 |
| JP | 11-293481 | 10/1999 |
| JP | 2002-139849 | 5/2002 |
| JP | 2007-273866 | 10/2007 |
| JP | 2006-514783 | 5/2008 |

OTHER PUBLICATIONS

Korean Patent Office Action, mailed May 2, 2008 and issued in corresponding Korean Patent Application No. 10-2007-0033006.
Japanese Office Action issued Jan. 28, 2011 in corresponding Japanese Patent Application 2008-092255.

* cited by examiner

*Primary Examiner* — Roberts Culbert
(74) *Attorney, Agent, or Firm* — Staas & Halsey LLP

(57) ABSTRACT

Disclosed is an etching method for a semiconductor device. The protecting layer, such as the hydrocarbon layer or the hydrocarbon layer containing phosphorous, is formed on the photoresist layer by using the precursor gas containing no fluorine. Therefore, the etching process enabling the thin photoresist to have a high selectivity can be performed, thereby improving the etching efficiency. The method includes the steps of placing a semiconductor substrate in a chamber, in which a material layer is formed on the semiconductor substrate and a photoresist layer is formed on the material layer, forming a hydrocarbon layer on the photoresist layer by introducing precursor gas containing no fluorine into the chamber and etching an etching target material by introducing etching gas into the chamber.

7 Claims, 5 Drawing Sheets

FIG. 5

| PRECURSOR GAS | PROTECTING LAYER | STATE OF GAS |
|---|---|---|
| Methane : $CH_4$ | carbon-carbon SINGLE BOND hydrogenated carbon layer | GAS |
| Butane : $C_4H_{10}$ | carbon-carbon SINGLE BOND hydrogenated carbon layer | LIQUID |
| Tributylphosphate : $(C_4H_9O)_3P=O$ | carbon-carbon SINGLE BOND phosphorous contained hydrogenated carbon layer | LIQUID |
| Cresol : $CH_3-C_6H_4-OH$ | carbon-carbon DOUBLE BOND hydrogenated carbon layer | LIQUID |
| Tricresylphosphate : $(CH_3-C_6H_4O)_3P=O$ | carbon-carbon DOUBLE BOND phosphorous contained hydrogenated carbon layer | LIQUID |

ETCHING APPARATUS AND METHOD FOR SEMICONDUCTOR DEVICE

CROSS-REFERENCE TO RELATED APPLICATIONS

This application claims the benefit of Korean Patent Application No. 10-2007-0033006, filed on Apr. 3, 2007, in the Korean Intellectual Property Office, the disclosure of which is incorporated herein by reference.

BACKGROUND

1. Field

One or more embodiments relate to an etching apparatus and method for a semiconductor device. More particularly, the embodiments relate to an etching method for a semiconductor device, capable of improving a selectivity of a photoresist in an etching process of the semiconductor device such as a wafer.

2. Description of the Related Art

In general, a device dimension of a semiconductor device is gradually becoming smaller, and thus, a photoresist is gradually becoming thinner in order to pattern a micro-sized structure.

Accordingly, a process enabling a thin photoresist to have a high selectivity is required.

U.S. Unexamined Patent Publication No. 2002/0102500 discloses a technology of forming a fluorinated carbon protecting layer. According to the above Publication, a step of depositing a protecting layer on a photoresist is added before an etching process such that the fluorinated carbon protecting layer can be formed by using CxHy-based etching gas such as fluoromethyl (CH3F), octafluorocyclobutane (C4F8), etc.

In detail, a material layer such as silicon oxide ($SiO_2$) is formed on a wafer, and the photoresist is coated and developed on the material layer. At this time, the material layer is etched through the etching process.

It is preferable if the photoresist has higher selectivity during the etching process. Here, the photoresist selectivity is obtained by dividing an etching rate of a target material by an etching rate of a non-target material.

In the conventional technology, instead of immediately etching the wafer introduced into an etching chamber, the operation adding the fluorinated carbon protecting layer on the photoresist is previously performed to protect the photoresist. Thus, the etching process is performed after protecting the top and sidewall of the photoresist.

However, since the fluorine is added, porosity of the fluorinated carbon protecting layer becomes greater thereby weakening the protection strength. In addition, the etch resistance of the fluorinated carbon protecting layer becomes reduced due to the etching effect of the fluorine, so the coupling strength between the fluorinated carbon protecting layer and the photoresist becomes relatively weaker.

Accordingly, there is limitation in enhancing the selectivity of the thin photoresist, so the etching efficiency is degraded.

SUMMARY

Additional aspects and/or advantages will be set forth in part in the description which follows and, in part, will be apparent from the description, or may be learned by practice of the invention.

Accordingly, it is an aspect of the embodiment to provide an etching method for a semiconductor device, capable of improving an etching efficiency by enhancing a selectivity of a thin photoresist.

Additional aspects and/or advantages of the invention will be set forth in part in the description which follows and, in part, will be apparent from the description, or may be learned by practice of the invention.

The foregoing and/or other aspects of the embodiments are achieved by providing an etching method for a semiconductor device comprising the steps of placing a semiconductor substrate in a chamber, in which a material layer is formed on the semiconductor substrate and a photoresist layer is formed on the material layer, forming a hydrocarbon layer on the photoresist layer by introducing precursor gas containing no fluorine into the chamber and etching an etching target material by introducing etching gas into the chamber.

According to an aspect of the embodiment, the precursor gas containing no fluorine is methane ($CH_4$).

According to an aspect of the embodiment, the hydrocarbon layer having a carbon-carbon single bond is formed on the photoresist layer by the methane.

According to an aspect of the embodiment, the precursor gas containing no fluorine is butane ($C_4H_{10}$).

According to an aspect of the embodiment, the hydrocarbon layer having a carbon-carbon single bond is formed on the photoresist layer by the butane.

According to an aspect of the embodiment, the precursor gas containing no fluorine is tributylphosphate ($((C_4H_9O)_3P=O)$).

According to an aspect of the embodiment, the hydrocarbon layer containing phosphorous (P) while having a carbon-carbon double bond is formed on the photoresist layer by the tributylphosphate.

According to an aspect of the embodiment, the precursor gas containing no fluorine is cresol ($CH_3-C_6H_4-OH$).

According to an aspect of the embodiment, the hydrocarbon layer having a carbon-carbon double bond is formed on the photoresist layer by the cresol.

According to an aspect of the embodiment, the precursor gas containing no fluorine is tricresylphosphate ($((CH_3-C_6H_4O)_3P=O)$).

According to an aspect of the embodiment, the hydrocarbon layer containing phosphorous (P) while having a carbon-carbon double bond is formed on the photoresist layer by the tricresylphosphate.

Further, according to an aspect of the embodiment, a pressure ranging from about 30 mT to about 200 mT, the precursor gas having an amount of about 50 SCCM to about 100 SCCM, a source power ranging from about 50 W to about 500 W and a bias power ranging from about 0 W to about 50 W are provided in the chamber to form the hydrocarbon layer.

According to an aspect of the embodiment, the hydrocarbon layer is formed on a top of the photoresist layer while having a thickness ranging from about 50 nm to about 100 nm, and formed at sidewalls of the photoresist layer while having a width ranging from about 10 nm to about 20 nm.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 5 is a table showing precursor gases and the type of protecting layers formed by the precursor gases.

DETAILED DESCRIPTION OF THE EMBODIMENTS

Figure 1:
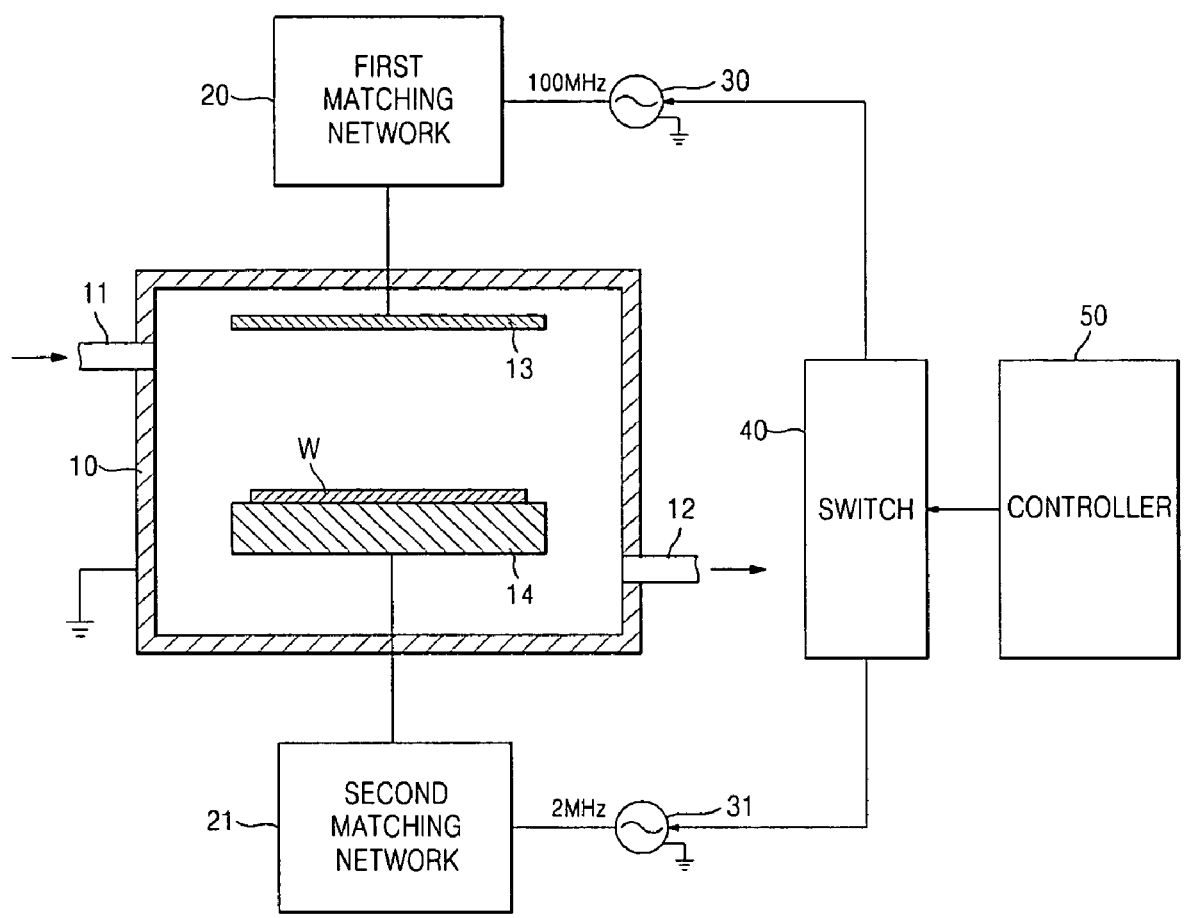
FIG. 1 is a schematic view showing a plasma etching device used in the present invention.

Reference will now be made in detail to the embodiments of the present invention, examples of which are illustrated in the accompanying drawings, wherein like reference numerals refer to the like elements throughout. The embodiments are described below to explain the present invention by referring to the figures.

FIG. 1 is a schematic view showing a plasma etching device used in an aspect of the embodiment. As shown in FIG. 1, the plasma etching device has a predetermined volume, and has a chamber 10 provided with a gas inlet 11 and a gas outlet 12. The chamber 10 is grounded. Precursor gas, which will be described later, and etching gas are introduced into the chamber 10 through the gas inlet 11, and the gases in the chamber 10 are exhausted to the exterior through the gas outlet 12.

A top electrode 13 and a bottom electrode 14 are provided in the chamber 10 while facing each other. The top electrode 13 and the bottom electrode 14 include a conductive material, and have a planar shape, respectively. The bottom electrode 14 fixes a wafer W. Preferably, an etching target layer of the wafer W has a multi-layered structure in which each layer has different etching characteristics. At least two of the etching target layers have a different ion density or/and ion energy for optimum etching.

The top electrode 13 and the bottom electrode 14 are connected to RF (radio frequency) power sources 30 and 31 through matching networks 20 and 21, respectively. The top electrode 13 is connected to a first RF power source 30 through a first matching network 20, and the bottom electrode 14 is connected to a second RF power source 31 through a second matching network 21. For instance, the first RF power source 30 applies a first RF power (source power) having a frequency of 100 MHz to the top electrode 13, and the second RF power source 31 applies a second RF power (bias power) having a frequency of 2 MHz, which is lower than the frequency of the first RF power, to the bottom electrode 14. For reference, since the frequency is proportional to the ion density of plasma and inversely proportional to the ion energy, if the frequency becomes higher, the ion density of plasma in the chamber 10 is increased and the ion energy is reduced. On the contrary, if the frequency becomes lower, the ion density of plasma in the chamber 10 is reduced and the ion energy is increased. Accordingly, the ion density of plasma can be increased by applying relatively high frequency to the top electrode 13, and the ion energy in the chamber 10 can be increased by applying relatively low frequency to the bottom electrode 14.

The first matching network 20 matches the impedances between the first RF power source 30 and the plasma in the chamber 10. The first matching network 20 is connected to the first RF power source 30 through an RF cable.

Similar to the first matching network 20, the second matching network 21 matches the impedances between the second RF power source 31 and the plasma in the chamber 10. The second matching network 21 is connected to the second RF power source 31 through the RF cable.

In addition, the first RF power source 30 and the second RF power source 31 are connected to a switch 40 through a signal cable, respectively.

The switch 40 separately turns on or off the first RF power source 30 and the second RF power source 31, such that the RF power is applied to the top electrode 13 and the bottom electrode 14. In this manner, the ion density and the ion energy in the chamber 10 can be adjusted.

A controller 50 controls the switch 40 in each operation of the plasma etching process, in such a manner that at least one of the first RF power RF1 and the second RF power RF2 is applied to the top electrode 13 or the bottom electrode 14.

Figure 2:
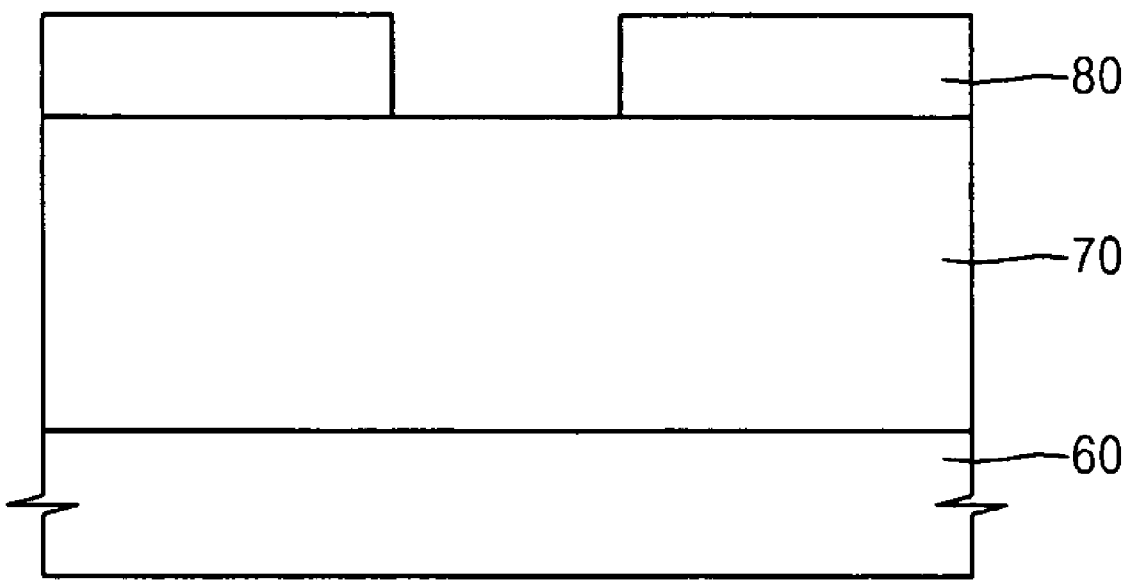
FIGS. 2 through 4 are sectional views showing an etching method for a semiconductor device according to an embodiment of the present invention.
Figure 3:
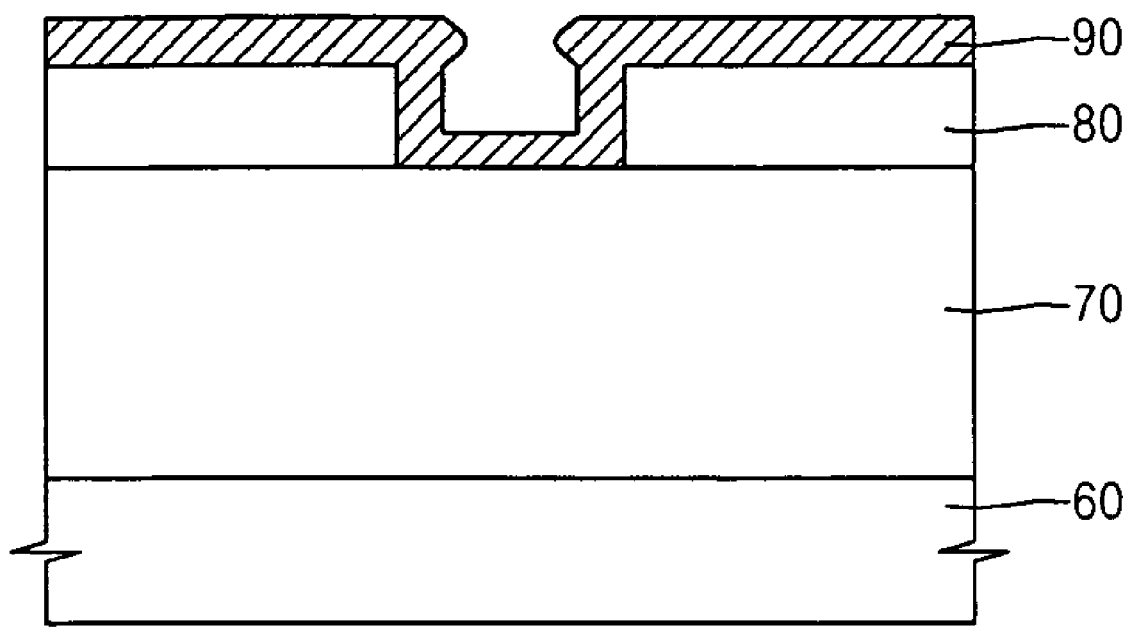
Figure 4:
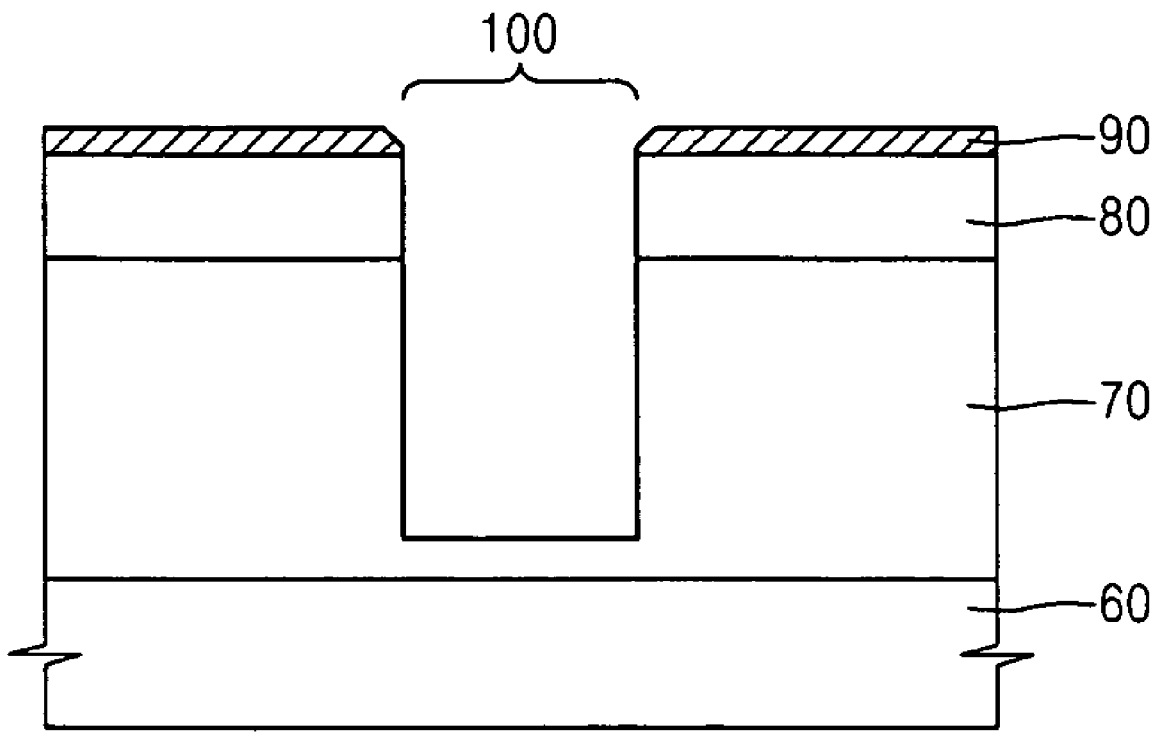

FIGS. 2 through 4 are sectional views showing an etching method for a semiconductor device according to an embodiment.

Referring to FIGS. 2 through 4, a semiconductor substrate 60, as shown in FIG. 2, is placed in the chamber. A material layer 70, such as silicon oxide, is formed on the semiconductor substrate 60, and a photoresist layer 80 is formed on the material layer 70.

Then, as shown in FIG. 3, precursor gas is introduced into the chamber to form a protecting layer 90, which can improve the selectivity of the photoresist, on the photoresist layer 80. The protecting layer 90 is formed to enhance the coupling strength between the photoresist layer 80 and the material layer 70 as well as to prevent etch resistance of the photoresist layer 80 from being weakened during the etching process for the material layer 70.

The protecting layer 90 includes a hydrocarbon layer having the same characteristics as the photoresist layer 80 or a hydrocarbon layer containing phosphorous (P), other than a fluorinated carbon protecting layer. Therefore, hydrocarbon gas containing no fluorine is used as the precursor gas. As described above, conventionally, the protecting layer 90 is formed by using etching gas containing the fluorine, which is highly reactive halogen, such as fluoromethyl (CH3F), octafluorocyclobutane (C4F8) and the like, to enhance the selectivity of the photoresist during the etching process. As a result, since the protecting layer 90 inevitably has the fluorine, porosity of the protecting layer 90 becomes greater, and the etch resistance of the protecting layer 90 becomes reduced due to the etching effect of the fluorine. Therefore, an embodiment, the hydrocarbon layer is formed as the protecting layer 90 of the photoresist layer 80 by using the hydrocarbon having no fluorine. In addition, the hydrocarbon layer containing phosphorous (P) can also be formed, and in this case, the coupling strength between the photoresist layer 80 and the material layer 70 can be further stronger.

As shown in FIG. 5, methane ($CH_4$), butane ($C_4H_{10}$), tributylphosphate (($C_4H_9O)_3P{=}O$), cresol ($CH_3{-}C_6H_4{-}OH$), tricresylphosphate (($CH_3{-}C_6H_4O)_3P{=}O$), etc. are used as the precursor gas.

The methane ($CH_4$) used as the precursor gas is in a gaseous state, and the butane ($C_4H_{10}$), tributylphosphate (($C_4H_9O)_3P{=}O$), cresol ($CH_3{-}C_6H_4{-}OH$) and tricresylphosphate (($CH_3{-}C_6H_4O)_3P{=}O$) are in a liquid state. Thus, when the gas in the liquid state, such as the butane ($C_4H_{10}$), tributylphosphate (($C_4H_9O)_3P{=}O$), cresol ($CH_3{-}C_6H_4{-}OH$) and tricresylphosphate (($CH_3{-}C_6H_4O)_3P{=}O$), is used, the gas is introduced into the chamber 10 after the gas in the liquid state is gasified by using a device that gasifies liquid.

The elementary composition of the protecting layer 90 and coupling characteristic between the elements of the protecting layer 90 are changed according to the type of the precursor gas.

When the methane ($CH_4$) and the butane ($C_4H_{10}$) are used as the precursor gas, the hydrocarbon layer having a carbon-carbon single bond is formed on the photoresist layer 80.

In addition, when the tributylphosphate (($C_4H_9O)_3P{=}O$) is used as the precursor gas, the hydrocarbon layer containing phosphorous (P) while having a carbon-carbon single bond is formed on the photoresist layer 80.

In addition, when the cresol ($CH_3$—$C_6H_4$—OH) is used as the precursor gas, the hydrocarbon layer having a carbon-carbon double bond is formed on the photoresist layer 80.

In addition, when the tricresylphosphate (($CH_3$—$C_6H_4O$)$_3$ P=O) is used as the precursor gas, the hydrocarbon layer having a carbon-carbon double bond is formed on the photoresist layer 80.

According to an aspect of embodiment, the hydrocarbon layer having the carbon-carbon single bond or the carbon-carbon double bond can be formed by selecting the type of the precursor gas, such that the etch resistance of the protecting layer 90 can be maximized. Further, the hydrocarbon layer containing phosphorous, which serves as a binder between carbon and oxygen, can be formed by using the precursor gas containing phosphorous, thereby increasing the etch resistance such that the selectivity of the photoresist can be improved.

In addition, because the etch resistance of the protecting layer 90 is reduced by forming the protecting layer 90, the additional process of forming an amorphous carbon layer or a diamond-like carbon layer at the bottom of the photoresist layer 80, which is performed in other equipment, can be omitted, thereby improving the speed of the etching process.

The protecting layer 90 has a thickness ranging from about 20 nm to about 100 nm. The protecting layer 90 is formed on the top of the photoresist layer 80 while having a thickness ranging from about 50 nm to about 100 nm, and formed at the sidewalls of the photoresist layer 80 while having a width ranging from about 10 nm to about 20 nm.

To form the protecting layer 90, the conditions in the chamber are set as follows. For instance, the conditions include a pressure ranging from about 30 mT to about 200 mT, the precursor gas having an amount of about 50 SCCM to about 100 SCCM, the source power ranging from about 50 W to about 50 W and the bias power ranging from about 0 W to about 50 W. At this time, in order to minimize the damage to the photoresist layer 80, only the source power can be applied without bias power.

Meanwhile, in order to form a contact hole 100 as shown in FIG. 4, the etching gas is introduced into the chamber 10 to etch the protecting layer 90, the photoresist layer 80 and the material layer 70, thereby completing the etching process.

As described above, according to an embodiment, the protecting layer, such as the hydrocarbon layer or the hydrocarbon layer containing phosphorous, is formed on the photoresist layer by using the precursor gas containing no fluorine. Therefore, the etching process enabling the thin photoresist to have a high selectivity can be performed, thereby improving the etching efficiency.

Moreover, according to the embodiment, because the etch resistance of the photoresist layer is reduced, the additional process of forming the amorphous carbon layer or the diamond-like carbon layer at the bottom of the photoresist layer, which is performed in other equipment, can be omitted, thereby improving the speed of the etching process.

Although few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An etching method for a semiconductor device, the method comprising:
   placing a semiconductor substrate in a chamber, in which a material layer is formed on the semiconductor substrate and a photoresist layer is formed on the material layer;
   forming a hydrocarbon layer on the photoresist layer by introducing precursor gas containing no fluorine into the chamber; and
   etching an etching target material by introducing etching gas into the chamber,
   wherein the precursor gas containing no fluorine is a precursor gas containing phosphorous (P).

2. The method of claim 1, wherein the precursor gas containing no fluorine is tributylphosphate (($C_4H_9O$)$_3$P=O).

3. The method of claim 2, wherein the hydrocarbon layer containing phosphorous (P) while having a carbon-carbon double bond is formed on the photoresist layer by the tributylphosphate.

4. The method of claim 1, wherein the precursor gas containing no fluorine is tricresylphosphate (($CH_3$—$C_6H_4O$)$_3$ P=O).

5. The method of claim 4, wherein the hydrocarbon layer containing phosphorous (P) while having a carbon-carbon double bond is formed on the photoresist layer by the tricresylphosphate.

6. The method of claim 1, wherein a pressure ranging from about 30 mT to about 200 mT, the precursor gas having an amount of about 50 SCCM to about 100 SCCM, a source power ranging from about 50 W to about 500 W and a bias power ranging from about 0 W to about 50 W are provided in the chamber to form the hydrocarbon layer.

7. The method of claim 1, wherein the hydrocarbon layer is formed on a top of the photoresist layer while having a thickness ranging from about 50 nm to about 100 nm, and formed at sidewalls of the photoresist layer while having a width ranging from about 10 nm to about 20 nm.

* * * * *